United States Patent
Wang et al.

(10) Patent No.: US 8,435,849 B2
(45) Date of Patent: May 7, 2013

(54) METHOD OF FORMING A CMOS IC HAVING A COMPRESSIVELY STRESSED METAL LAYER IN THE NMOS AREA

(75) Inventors: Xin Wang, New York, NY (US); Zhiqiang Wu, Plano, TX (US); Ramesh Venugopal, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/440,344

(22) Filed: Apr. 5, 2012
(Under 37 CFR 1.47)

(65) Prior Publication Data
US 2012/0190158 A1     Jul. 26, 2012

Related U.S. Application Data

(62) Division of application No. 12/538,468, filed on Aug. 10, 2009, now abandoned.

(60) Provisional application No. 61/087,212, filed on Aug. 8, 2008.

(51) Int. Cl.
*H01L 21/8238* (2006.01)

(52) U.S. Cl.
USPC .................................. 438/199; 257/369

(58) Field of Classification Search .......... 438/199–209, 438/234; 257/E21.632, 369
See application file for complete search history.

(56) References Cited

U.S. PATENT DOCUMENTS

| 2007/0040225 A1 | 2/2007 | Yang |
| 2008/0096338 A1 | 4/2008 | Zhang et al. |
| 2008/0217700 A1 | 9/2008 | Doris et al. |

*Primary Examiner* — Julio J Maldonado
*Assistant Examiner* — Robert Bachner
(74) *Attorney, Agent, or Firm* — Jacqueline J. Garner; Wade J. Brady, III; Frederick J. Telecky, Jr.

(57) ABSTRACT

A gate stack for an NMOS transistor in an IC to induce tensile stress in the NMOS channel is disclosed. The gate stack includes a first layer of undoped polysilicon, a second layer of n-type polysilicon to establish a desired work function in the gate, layer of compressively stressed metal, and a third layer of polysilicon to provide a silicon surface for subsequent formation of metal silicide. Candidates for the compressively stressed metal are TiN, TaN, W, and Mo. In a CMOS IC, the n-type polysilicon layer and metal layer are patterned in NMOS transistor areas, while the first polysilicon layer and third polysilicon layer are patterned in both NMOS and PMOS transistor areas. Polysilicon CMP may be used to reduce topography between the NMOS and PMOS gate stacks to facilitate gate pattern photolithography.

8 Claims, 15 Drawing Sheets

US 8,435,849 B2

METHOD OF FORMING A CMOS IC HAVING A COMPRESSIVELY STRESSED METAL LAYER IN THE NMOS AREA

CROSS REFERENCE TO RELATED APPLICATIONS

This application is a divisional of U.S. Nonprovisional patent application Ser. No. 12/538,468, filed Aug. 10, 2009, which is a provisional of U.S. Provisional application Ser. No. 61/087,212 filed Aug. 8, 2008, the contents of which are herein incorporated by reference in its entirety.

FIELD OF THE INVENTION

This invention relates to the field of integrated circuits. More particularly, this invention relates to methods to improve NMOS transistor in integrated circuits.

BACKGROUND OF THE INVENTION

It is well known that compressive stress improves on-state current in p-channel metal oxide semiconductor (PMOS) transistors, while tensile stress improves on-state current in n-channel metal oxide semiconductor (NMOS) transistors. It is common for integrated circuits (ICs) to include a tensile layer over the NMOS transistors. Adding tensile stress to NMOS transistors while without degrading PMOS transistors in an IC has been problematic.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a gate stack for an n-channel metal oxide semiconductor (NMOS) transistor which includes a first layer of polycrystalline silicon, commonly known as polysilicon, which is undoped, over the gate dielectric layer, a second layer of polysilicon, which is n-type, over the undoped polysilicon layer, to establish a desired work function in the gate, a layer of metal over the n-type polysilicon layer, which is under compressive stress, and a third layer of polysilicon over the metal layer to provide a silicon surface for subsequent formation of metal silicide. The compressive metal may be titanium nitride (TiN), tantalum nitride (TaN), tungsten (W), molybdenum (Mo), or another metal that generates tensile stress in the channel region of the NMOS transistor, reduces diffusion of dopants from the lower layers of polysilicon to the upper layer of polysilicon, and is compatible with anneal processes used in fabrication of the IC. In a complementary metal oxide semiconductor (CMOS) IC, which includes both NMOS and PMOS transistors, the n-type polysilicon layer and metal layer are patterned in NMOS transistor areas, while the first polysilicon layer and third polysilicon layer are patterned in both NMOS and PMOS transistor areas. Chemical mechanical polishing (CMP) may be used to reduce differences in height between the gate stacks of the NMOS and PMOS transistors to facilitate gate pattern photolithographic processing.

An advantage of the instant invention is improved on-state current in NMOS transistors in ICs.

DETAILED DESCRIPTION

Figure 1A:
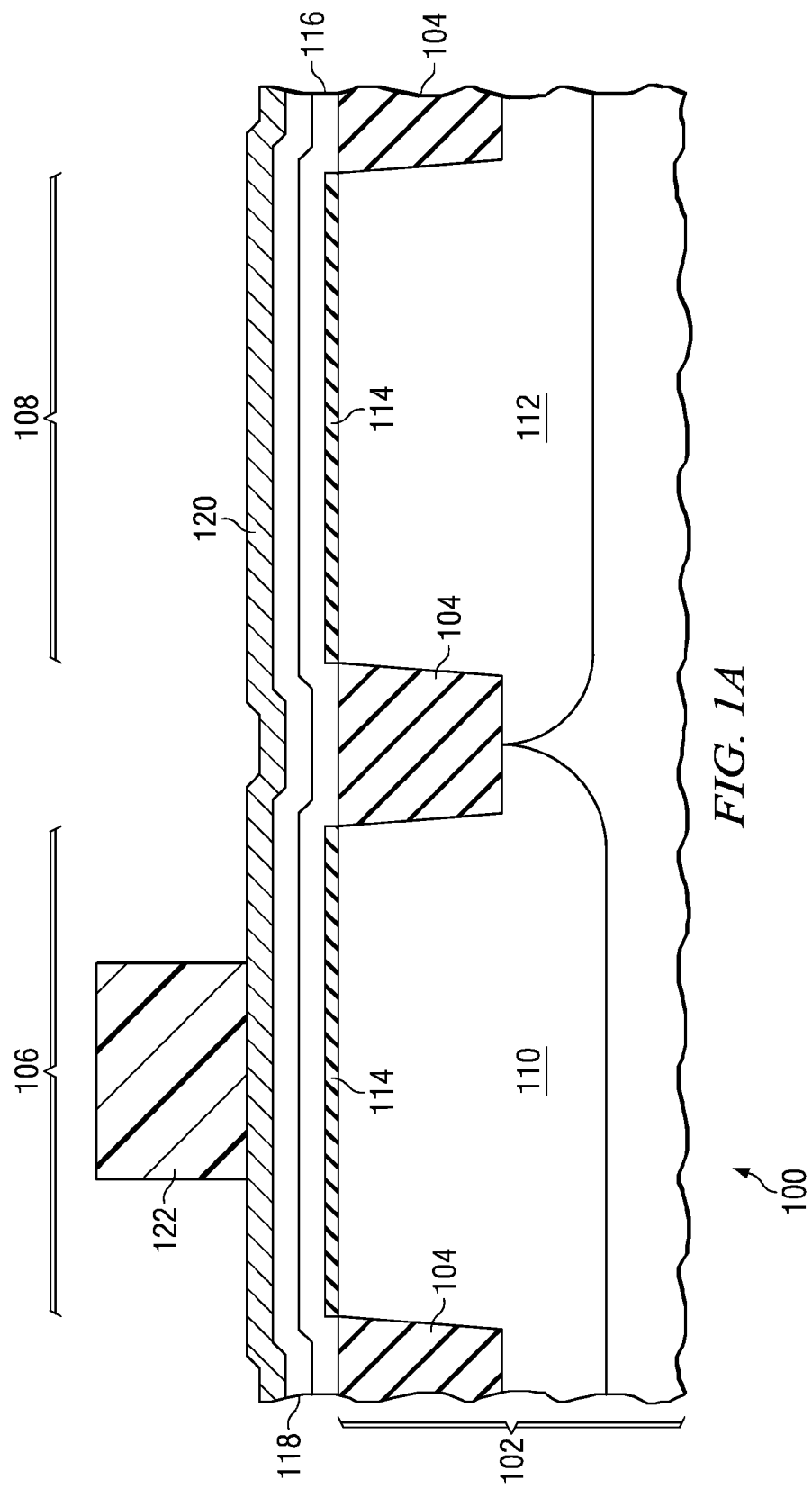
FIG. 1A through FIG. 1E are cross-sections of an IC containing an NMOS transistor including a first embodiment of the inventive gate stack and a PMOS transistor, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a gate stack for an n-channel metal oxide semiconductor (NMOS) transistor in an integrated circuit (IC) which induces tensile stress in a channel region below the gate stack to improve on-state current in the NMOS transistor. The inventive gate stack includes a first layer of amorphous silicon or polycrystalline silicon, commonly known as polysilicon, which is undoped, formed on a top surface of a gate dielectric layer, a second layer of polysilicon or amorphous silicon, which is n-type, formed on a top surface of the undoped polysilicon or amorphous silicon layer, to establish a desired work function in the gate, a layer of metal, which is under compressive stress, formed on a top surface of the second polysilicon or amorphous silicon layer, and a third layer of polysilicon or amorphous silicon formed on a top surface of the metal layer, to provide a silicon surface for subsequent formation of metal silicide. The compressively stressed metal may be titanium nitride (TiN), tantalum nitride (TaN), tungsten (W), molybdenum (Mo), or another metal that generates tensile stress in a channel region of the NMOS transistor, reduces diffusion of dopants between the lower layers polysilicon or amorphous silicon and the upper layer of polysilicon or amorphous silicon, and is compatible with anneal processes used in fabrication of the IC. In a complementary metal oxide semiconductor (CMOS) IC, which includes both NMOS and PMOS transistors, the n-type polysilicon layer and metal layer are patterned in NMOS transistor areas, while the first polysilicon or amorphous silicon layer and third polysilicon or amorphous silicon layer are patterned in both NMOS and PMOS transistor areas. Chemical mechanical polishing (CMP) may be used to reduce differences in height between gate stacks of the NMOS and PMOS transistors to facilitate gate pattern photolithographic processing.

To improve readability of this disclosure, it will be understood that the term polysilicon will include both polysilicon and amorphous silicon. Layers described as being formed of polysilicon are understood to be formed of either polysilicon or amorphous silicon, or a combination of both. Similarly, references to methods of etching polysilicon will be understood to include methods of etching polysilicon and etching amorphous silicon, as appropriate. Likewise, references to methods of oxidizing polysilicon will be understood to include methods of oxidizing polysilicon and oxidizing amorphous silicon, as appropriate. Other references to structures or processes involving polysilicon are understood to include polysilicon and amorphous silicon, as appropriate.

FIG. 1A through FIG. 1E are cross-sections of an IC containing an NMOS transistor including a first embodiment of the inventive gate stack and a PMOS transistor, depicted in successive stages of fabrication. Referring to FIG. 1A, the IC 100 is formed in a substrate 102, typically p-type single crystal silicon, but possibly a silicon-on-insulator (SOI) wafer which has a layer of single crystal silicon over a buried insulating layer, or a hybrid orientation technology (HOT) wafer which has regions of different crystal orientation for different components, or any other substrate which supports fabrication of the IC 100. Elements of field oxide 104 are formed by a shallow trench isolation (STI) process sequence, in which trenches, commonly 200 to 500 nanometers deep, are etched into the IC 100, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). The field oxide 104 isolates an area defined for an NMOS transistor 106 from an area defined for a PMOS transistor 108. A p-type well 110, commonly called a p-well, is formed in the substrate 102, typically by ion implanting a p-well set of p-type dopants, including boron and possibly gallium and/or indium, at a total dose from $5 \cdot 10^{12}$ to $3 \cdot 10^{14}$ atoms/cm$^2$, into the NMOS transistor area 106. A p-well photoresist pattern, not shown in FIG. 1A for clarity, is commonly used to block the p-well set of p-type dopants from areas outside the p-well area. The p-well 110 extends from a top surface of the substrate 102 to a depth typically 50 to 500 nanometers below a bottom surface of the field oxide elements 104. The ion implantation process to form the p-well 110 may include additional steps to implant additional p-type dopants at shallower depths for purposes of improving NMOS transistor performance, such as threshold adjustment, leakage current reduction and suppression of parasitic bipolar operation. An n-type well 112, commonly called an n-well, is formed in the substrate 102, typically by ion implanting an n-well set of n-type dopants, including phosphorus and arsenic, and possibly antimony, at a total dose from $5 \cdot 10^{12}$ to $3 \cdot 10^{14}$ atoms/cm$^2$, into the PMOS transistor area 108. An n-well photoresist pattern, not shown in FIG. 1A for clarity, is commonly used to block the n-well set of n-type dopants from areas outside the n-well. The n-well 112 extends from the top surface of the substrate 102 to a depth typically 50 to 500 nanometers below the bottom surface of the field oxide elements 104. The ion implantation process to form the n-well 112 may include additional steps to implant additional n-type dopants at shallower depths for purposes of improving PMOS transistor performance, such as threshold adjustment, leakage current reduction and suppression of parasitic bipolar operation. A sheet resistivity of the n-well 112 is commonly between 100 and 1500 ohms/square.

Continuing to refer to FIG. 1A, a gate dielectric layer 114, typically silicon dioxide, nitrogen doped silicon dioxide, silicon oxy-nitride, hafnium oxide, layers of silicon dioxide and silicon nitride, or other insulating material, between 1 and 5 nanometers thick, is formed on a top surface of the p-well 110 and a top surface of the n-well 112, using known methods of gate dielectric layer formation. A first layer of polysilicon 116, which is undoped and is preferably between 2 and 10 nanometers thick, is formed on a top surface of the gate dielectric layer 114 using known polysilicon deposition methods. A second layer of polysilicon 118, preferably between 2 and 10 nanometers thick, and which includes n-type dopants such as phosphorus, arsenic and/or antimony at a concentration preferably between $1 \cdot 10^{20}$ and $1 \cdot 10^{22}$ cm$^{-2}$, is formed on a top surface of the first polysilicon layer 116, using known doped polysilicon deposition methods. A layer of compressively stressed metal 120, preferably between 10 and 30 nanometers thick, is formed on a top surface of the second polysilicon layer 118, using known metal deposition methods. The compressively stressed metal is preferably TiN, but may be TaN, W, Mo, or another metal which is compressively stressed in the gate stack so as to generate tensile stress in a channel region below the gate stack, reduces diffusion of dopants between the first and second polysilicon layers and the third polysilicon layer, and is compatible with subsequent lightly doped drain (LDD) and source/drain (SD) anneal processes used in fabrication of the IC. A compressive stress level of the compressively stressed metal is preferably between 800 and 3500 MPa.

Still referring to FIG. 1A, an NMOS stress layer photoresist pattern 122 is formed on a top surface of the compressively stressed metal layer 120 in the NMOS transistor area 106 using known photolithographic methods to define areas for the NMOS stress layer. In a preferred embodiment, the area defined for the NMOS stress layer is larger than an area of the final NMOS gate stack, to be defined in a subsequent process step.

Figure 1B:
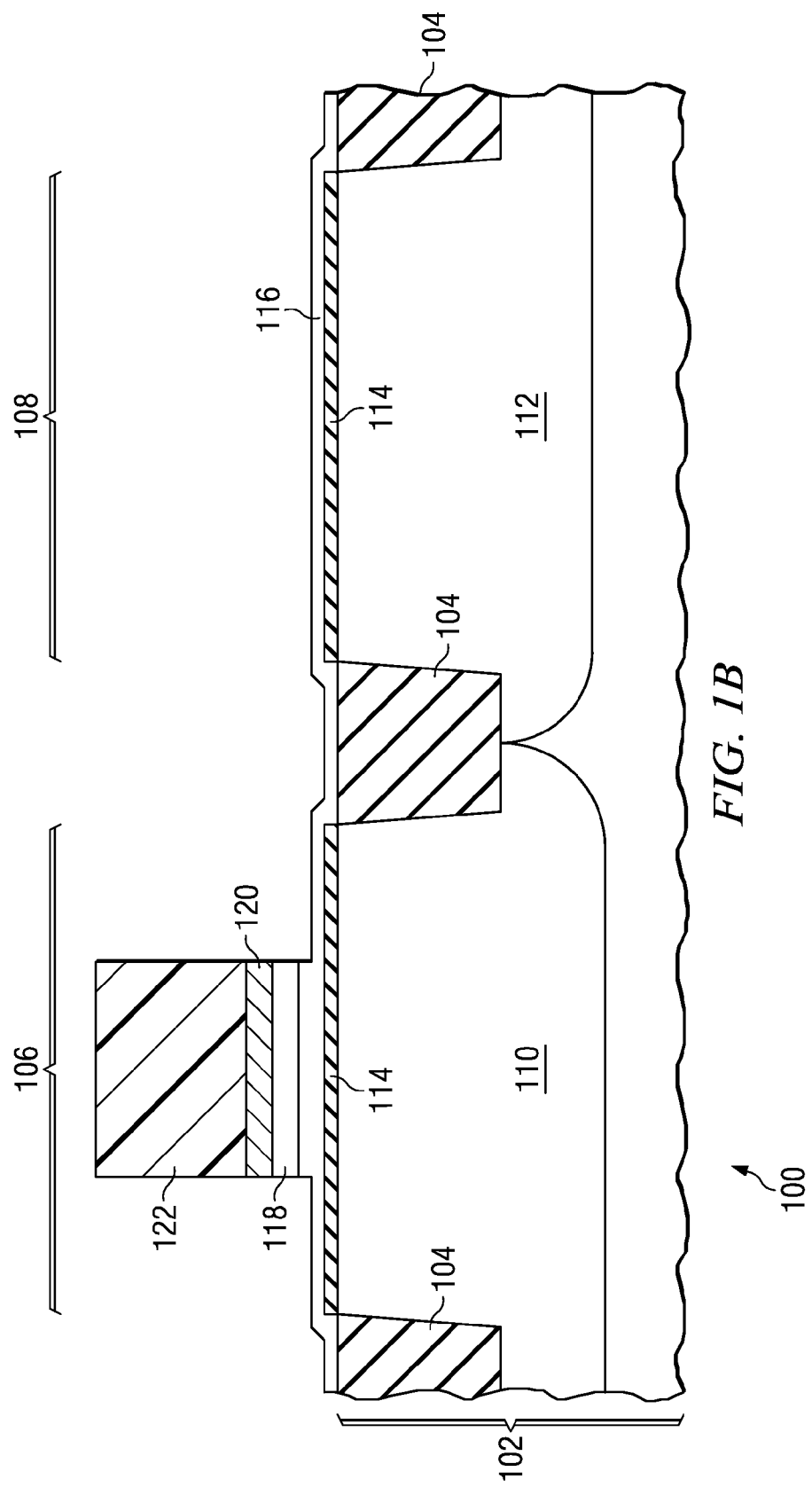

FIG. 1B depicts the IC 100 after an NMOS stress layer etch process. Compressively stressed metal 120 is removed from areas outside the NMOS gate stack area using known metal etching methods. The second polysilicon layer 118 is also removed from areas outside the NMOS gate stack area using known polysilicon etching methods. A portion of the first polysilicon layer 116 is removed from areas outside the NMOS stress layer area, preferably leaving more than 2 nanometers of polysilicon on the top surface of the gate dielectric layer 114, using known polysilicon etching methods. After the NMOS stress layer etch process is performed, the NMOS stress layer photoresist pattern 122 is removed, commonly by exposing the IC 100 to an oxygen containing plasma, followed by a wet cleanup to remove any organic residue from the top surface of the IC 100.

Figure 1C:
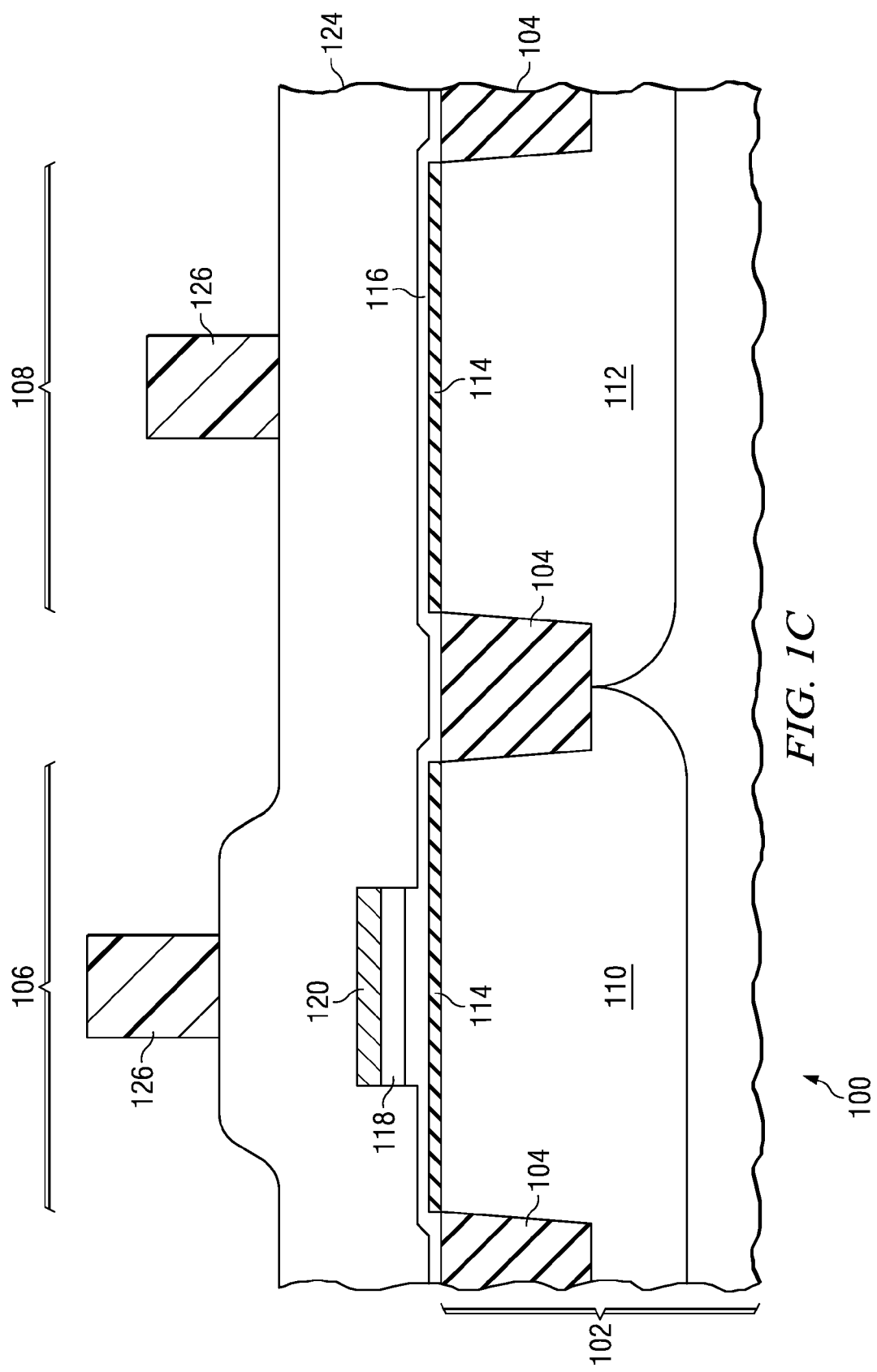

FIG. 1C depicts the IC 100 at a subsequent stage of fabrication. A third layer of polysilicon 124 is formed on the top surface of the IC 100. The third polysilicon layer is preferably between 30 and 70 nanometers thick, and includes p-type dopants such as boron, and possibly indium and/or gallium, at a concentration preferably between $1 \cdot 10^{19}$ and $1 \cdot 10^{22}$ cm$^{-2}$. A gate photoresist pattern 126 is formed on a top surface of the third polysilicon layer 124 using known photolithographic methods to define areas for gates of an NMOS transistor and a PMOS transistor in the NMOS transistor area 106 and the PMOS transistor area 108, respectively.

Figure 1D:
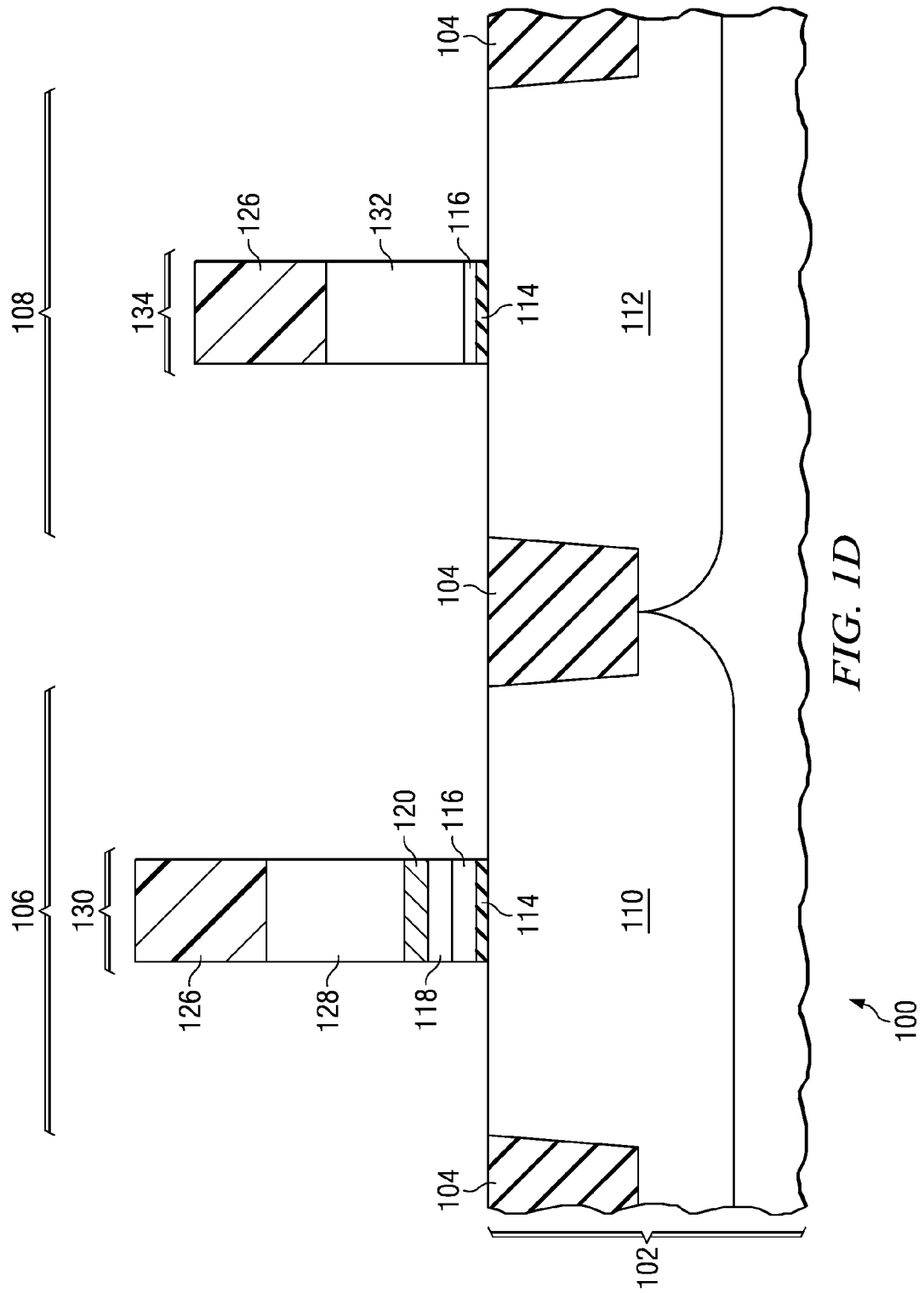

FIG. 1D depicts the IC 100 after a gate etch process. Polysilicon from the third polysilicon layer is removed during the gate etch process using known polysilicon etching methods to form an NMOS upper polysilicon or amorphous silicon gate layer 128 in the inventive NMOS gate stack 130 defined by the gate photoresist pattern 126 in the NMOS transistor area 106 and to form a PMOS upper polysilicon gate layer 132 in a PMOS gate stack 134 defined by the gate photoresist pattern 126 in the PMOS transistor area 108. Compressively stressed metal 120 is removed during the gate etch process using known metal etching methods outside the area of the NMOS gate stack 130. Polysilicon from the second polysilicon layer 118 is removed during the gate etch process using known polysilicon etching methods outside the area of the NMOS gate stack 130. Similarly, polysilicon from the first polysilicon layer 116 is removed during the gate etch process using known polysilicon etching methods outside the areas of the NMOS gate stack 130 and the PMOS gate stack 134. After the gate etch process is performed, the gate photoresist pattern 126 is removed, commonly by exposing the IC 100 to an oxygen containing plasma, followed by a wet cleanup to remove any organic residue from the top surface of the IC 100.

Figure 1E:
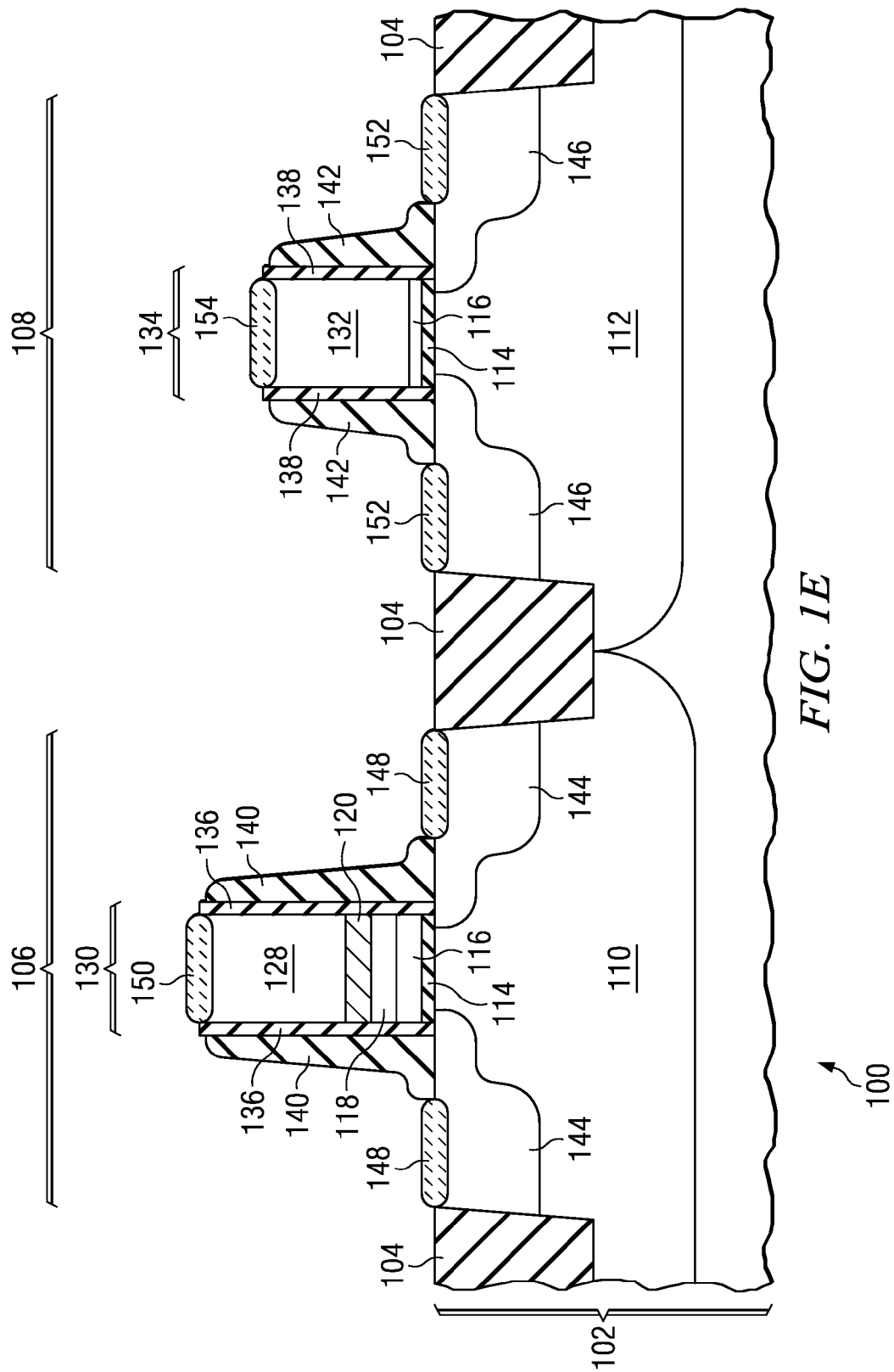

FIG. 1E depicts the IC 100 after fabrication of the NMOS transistor and PMOS transistor is complete. After the gate photoresist pattern is removed, NMOS offset spacers 136 are formed on lateral surfaces of the NMOS gate stack 130, preferably using known methods such as polysilicon oxidation and deposition of conformal layers of silicon dioxide and/or silicon nitride on a top surface and the lateral surfaces of the NMOS gate stack 130, followed by anisotropic etching to remove the grown silicon dioxide and deposited silicon dioxide and/or silicon nitride from the top surface of the NMOS gate stack 130 to leave the NMOS offset spacers 136 on the lateral surfaces of the NMOS gate stack 130. PMOS offset spacers 138 are formed on lateral surfaces of the PMOS gate stack 134, using similar processes to those employed to form the NMOS offset spacers 136. Thicknesses of the NMOS offset spacers 136 and PMOS offset spacers 138 are established to optimize performance of the NMOS and PMOS transistors, respectively, and are not necessarily equal.

Continuing to refer to FIG. 1E, n-type lightly doped drain (NLDD) implanted regions are formed in the top region of the p-well 110 adjacent to the NMOS offset spacers 136, typically by ion implanting an NLDD set of n-type dopants, including phosphorus and arsenic, and possibly antimony, at a total dose between $1 \cdot 10^{14}$ and $3 \cdot 10^{15}$ atoms/cm$^2$, into areas defined for the NLDD implanted regions. An NLDD photoresist pattern, not shown in FIG. 1E for clarity, is commonly used to block the NLDD set of n-type dopants from areas outside the NLDD implanted regions. The NLDD implanted regions typically extend from the top surface of the p-well 110 to a depth between 10 and 50 nanometers.

Similarly, P-type lightly doped drain (PLDD) implanted regions are formed in the top region of the n-well 112 adjacent to the PMOS offset spacers 138, typically by ion implanting a PLDD set of p-type dopants, including boron, commonly in the form BF$_2$, and possibly gallium or indium, at a total dose between $1 \cdot 10^{14}$ and $3 \cdot 10^{15}$ atoms/cm$^2$, into areas defined for the PLDD implanted regions. A PLDD photoresist pattern, not shown in FIG. 1E for clarity, is commonly used to block the PLDD set of p-type dopants from areas outside the PLDD implanted regions. The PLDD implanted regions typically extend from the top surface of the n-well 112 to a depth between 10 and 50 nanometers.

An optional anneal operation may be performed after the NLDD implant operation and/or the PLDD implant operation to activate a portion of the NLDD set of dopants in the NLDD implanted regions and/or activate a portion of the PLDD dopants in the PLDD regions to form NLDD diffused regions and PLDD diffused regions, respectively.

Continuing to refer to FIG. 1E, NMOS gate sidewall spacers 140 are formed on lateral surfaces of the NMOS offset spacers 136, typically by deposition of one or more conformal layers of silicon nitride and/or silicon dioxide on a top surface of the NMOS gate stack 130 and lateral surfaces of the NMOS offset spacers 136 and the top surface of the p-well 110, followed by removal of the conformal layer material from the top surface of the NMOS gate stack 130 and the top surface of the p-well 110 by known anisotropic etching methods, leaving the conformal layer material on the lateral surfaces of the NMOS offset spacers 136. PMOS gate sidewall spacers 142 are formed on lateral surfaces of the PMOS offset spacers 138, by a similar process sequence as the NMOS gate sidewall spacers 140. Thicknesses of the NMOS gate sidewall spacers 140 and PMOS gate sidewall spacers 142 are established to optimize performance of the NMOS and PMOS transistors, respectively, and are not necessarily equal.

Still referring to FIG. 1E, N-type source drain (NSD) implanted regions are formed in the top region of the p-well 110 adjacent to the NMOS gate sidewall spacers 140, typically by ion implanting an NSD set of n-type dopants, including phosphorus and arsenic, and possibly antimony, at a total dose between $3 \cdot 10^{14}$ and $2 \cdot 10^{16}$ atoms/cm$^2$ into NSD implanted regions which are continuous with the NLDD regions. An NSD photoresist pattern, not shown in FIG. 1E for clarity, is commonly used to block the NSD set of n-type dopants from areas outside the NSD implanted regions. An NSD anneal operation activates a portion of the n-type dopants in the NSD implanted regions to form NSD regions 144 which include the NLDD regions. The NSD regions 144 typically extend from the top surface of the p-well 110 to a depth between 100 and 500 nanometers. During the NSD anneal operation, n-type dopants in the second polysilicon layer 118 diffuse into the first polysilicon layer 116 in the NMOS gate stack 130, convert the first polysilicon layer 116 to n-type, and establish a desired work function for the NMOS gate stack 130.

P-type source drain (PSD) implanted regions are formed in the top region of the n-well 112 adjacent to the PMOS gate sidewall spacers 142, typically by ion implanting a PSD set of p-type dopants, including boron, sometimes partly in the form BF$_2$, and possibly indium and/or gallium, at a total dose between $3 \cdot 10^{14}$ and $2 \cdot 10^{16}$ atoms/cm$^2$ into PSD implanted regions which are continuous with the PLDD regions. A PSD photoresist pattern, not shown in FIG. 1E for clarity, is commonly used to block the PSD set of p-type dopants from areas outside the PSD implanted regions. A PSD anneal operation activates a portion of the p-type dopants in the PSD implanted regions to form PSD regions 146 which include the PLDD regions. The PSD regions 146 typically extend from the top surface of the n-well 112 to a depth between 100 and 500 nanometers. During the PSD anneal operation, p-type dopants from the PMOS upper polysilicon gate layer 132 diffuse into the first polysilicon layer 116 in the PMOS gate stack 134, convert the first polysilicon layer 116 to p-type, and establish a desired work function in the PMOS gate stack 134.

It is common to perform the NSD anneal operation and the PSD anneal operation concurrently.

Metal silicide, such as nickel silicide or cobalt silicide, is formed on exposed areas of the top surfaces of the NSD regions 144, the top surface of the NMOS gate stack 130, the top surfaces of the PSD regions 146 and the top surface of the PMOS gate stack 134, using known methods such as depositing a layer of metal, such as nickel or cobalt, on a top surface of the IC 100, heating the IC 100 to react a portion of the metal with exposed silicon in active areas of the IC 100, and selectively removing unreacted metal from the IC 100 surface, commonly by exposing the IC 100 to wet etchants including a mixture of an acid and hydrogen peroxide. In this manner, NSD silicide layers 148 are formed on the top surfaces of the NSD regions 144, an NMOS gate silicide layer 150 is formed on the top surface of the NMOS gate stack 130, PSD silicide layers 152 are formed on the top surfaces of the PSD regions 146, and a PMOS gate silicide layer 154 is formed on the top surface of the PMOS gate stack 134.

The embodiment described in reference to FIG. 1A through FIG. 1E is advantageous because the combination of the compressively stressed metal layer 120 with the underlying polysilicon layers 116, 118 and the sidewalls 140 induces a tensile stress in the channel region in the NMOS transistor area 106 immediately below the gate dielectric layer 114 so as to improve an on-state current of the NMOS transistor 106. Because the compressively stressed metal layer 120 is not in the PMOS gate stack 134, tensile stress is advantageously not induced in a channel region of the PMOS transistor 108.

In an alternate embodiment, the third polysilicon layer 124, as described in reference to FIG. 1C, may be undoped. The PMOS upper polysilicon gate layer 132, as described in reference to FIG. 1D and FIG. 1E, receives p-type dopants during the PSD implant operation, which diffuse into the first polysilicon layer 116 in the PMOS gate stack 134, as described in reference to FIG. 1E, to establish a desirable work function of the PMOS gate stack 134.

Figure 2A:
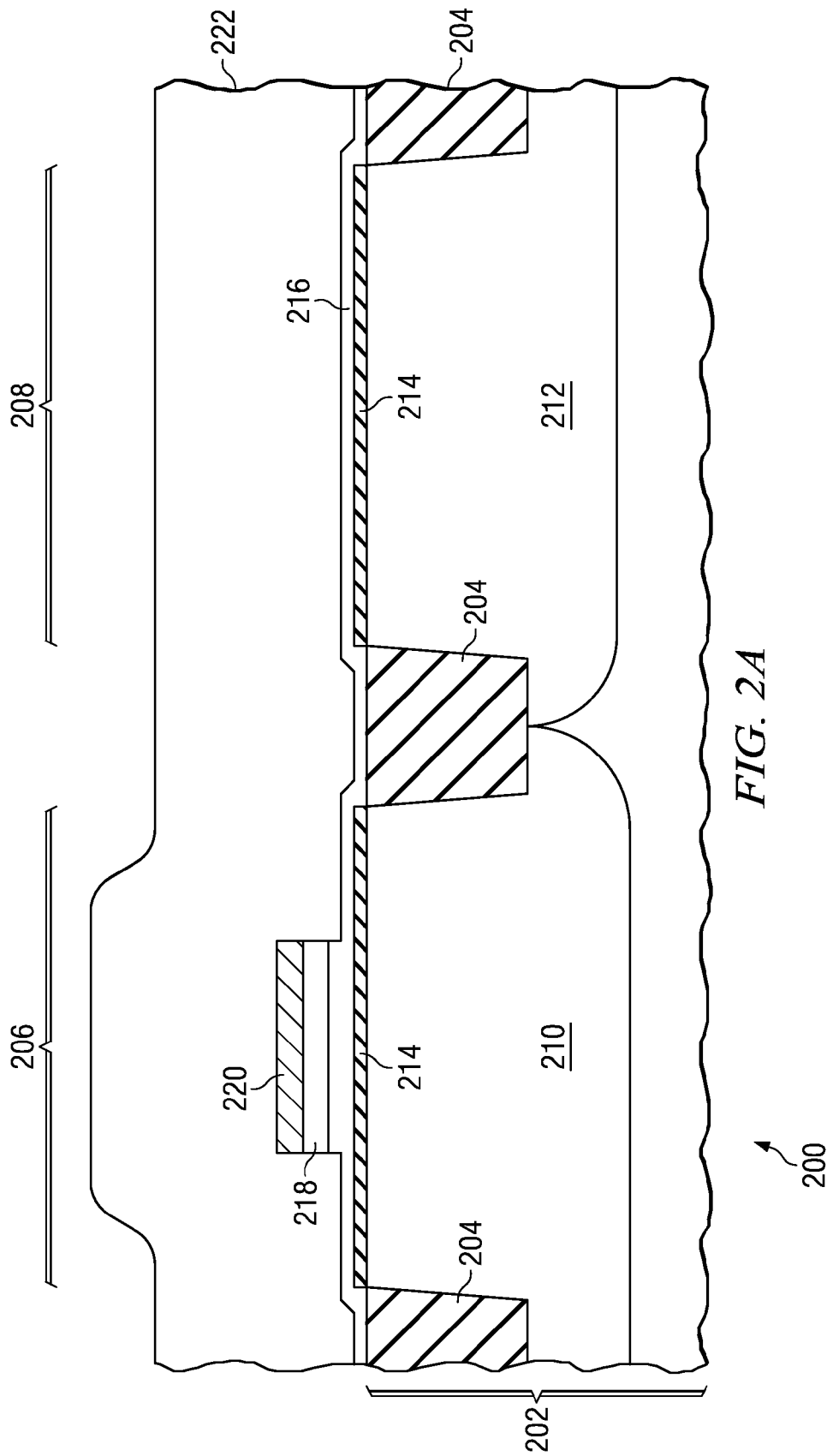
FIG. 2A through FIG. 2E are cross-sections of an IC containing an NMOS transistor including a second embodiment of the inventive gate stack and a PMOS transistor, depicted in successive stages of fabrication.

FIG. 2A through FIG. 2E are cross-sections of an IC containing an NMOS transistor including a second embodiment of the inventive gate stack and a PMOS transistor, depicted in successive stages of fabrication. Referring to FIG. 2A, the IC 200 is formed in a substrate 202 with the properties described in reference to FIG. 1A. Elements of field oxide 204 are formed by an STI process sequence to isolate an area defined for an NMOS transistor 206 from an area defined for a PMOS transistor 208. A p-well 210 is formed in the substrate 202 in the NMOS area 206 by processes described in reference to FIG. 1A. An n-well 212 is formed in the substrate 202 in the PMOS area 208 by processes described in reference to FIG. 1A. A gate dielectric layer 214 as described in reference to FIG. 1A is formed on a top surface of the p-well 210 and a top surface of the n-well 212. A first layer of polysilicon 216, undoped, preferably between 2 and 10 nanometers thick, is formed on a top surface of the gate dielectric layer 214, using known polysilicon deposition methods. A second layer of polysilicon 218, preferably between 2 and 10 nanometers thick, and which includes n-type dopants such as phosphorus, arsenic and/or antimony at a concentration preferably between $1 \cdot 10^{20}$ and $1 \cdot 10^{22}$ $cm^{-2}$, is formed on a top surface of the first polysilicon layer 216, using known doped polysilicon deposition methods. A layer of compressively stressed metal 220, with properties described in reference to FIG. 1A, preferably between 10 and 30 nanometers thick, is formed on a top surface of the second polysilicon layer 218, using known metal deposition methods. The compressively metal layer 220, second polysilicon layer 218 and first polysilicon layer 216 are etched in areas outside an NMOS stress layer area, which is defined by an NMOS stress layer photoresist pattern, not shown in FIG. 1A for clarity, by processes described in reference to FIG. 1B. In a preferred embodiment, more than 2 nanometers of the first polysilicon layer 116 is left on the top surface of the gate dielectric layer 114. A third layer of polysilicon 222, preferably between 30 and 70 nanometers thick, is formed on the top surface of the IC 100. The third polysilicon layer is p-type, as described in reference to FIG. 1C. A top surface of the third polysilicon layer 222 is higher in the NMOS area 206 than in the PMOS area 208 due to the presence of the compressively stressed metal layer 220, second polysilicon layer 218 and first polysilicon layer 216 in the NMOS area 206.

Figure 2B:
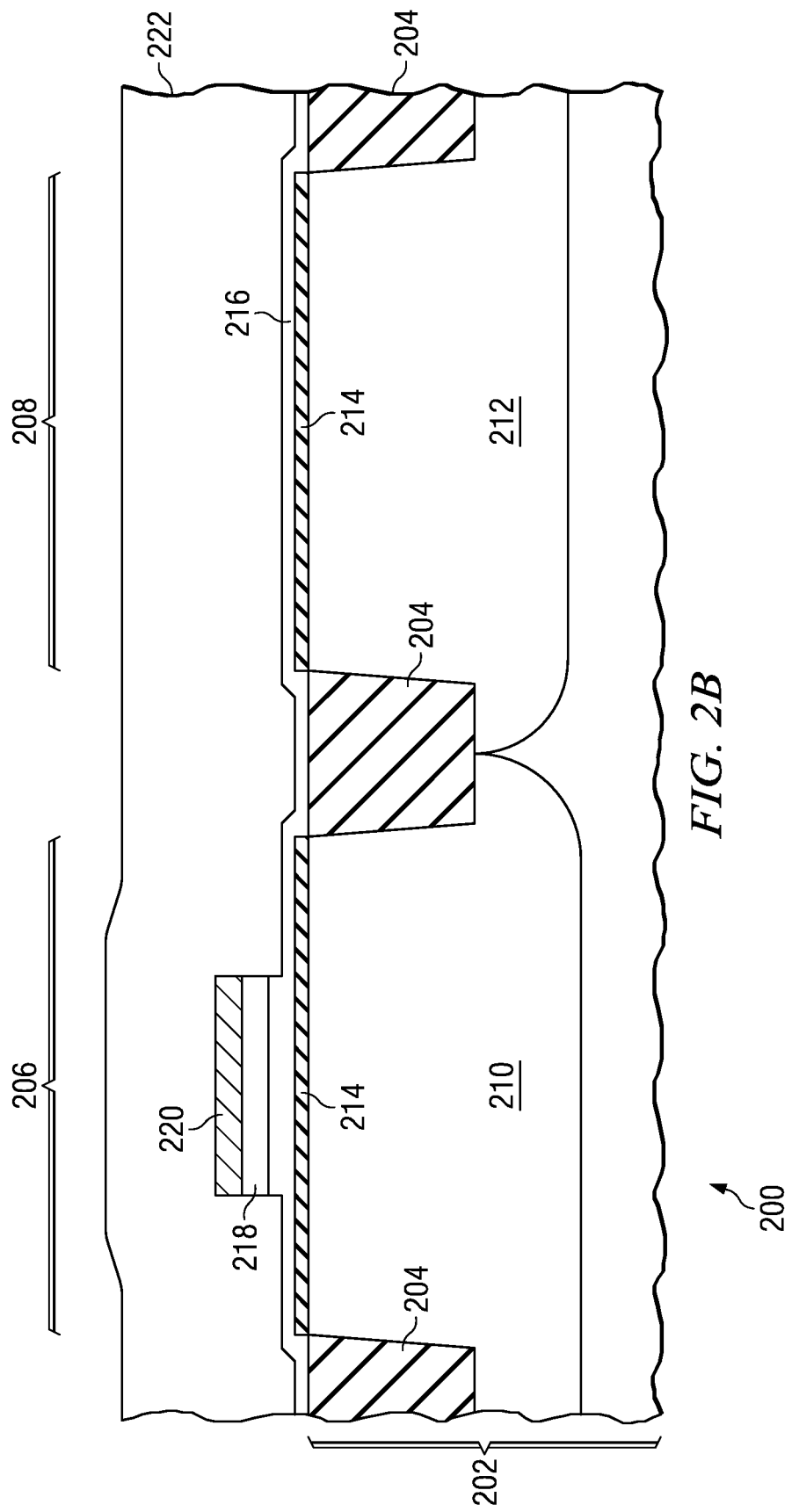

FIG. 2B depicts the IC 200 after a polysilicon CMP operation which reduces a height difference in the top surface of the third polysilicon layer 222 between the NMOS area 206 and the PMOS area 208. The polysilicon CMP operation is performed using known CMP methods. A thickness of the third polysilicon layer 222 may be reduced in the PMOS area 208 by the polysilicon CMP operation. In a preferred embodiment, the height difference in the top surface of the third polysilicon layer 222 between the NMOS area 206 and the PMOS area 208 is less than 10 nanometers.

Figure 2C:
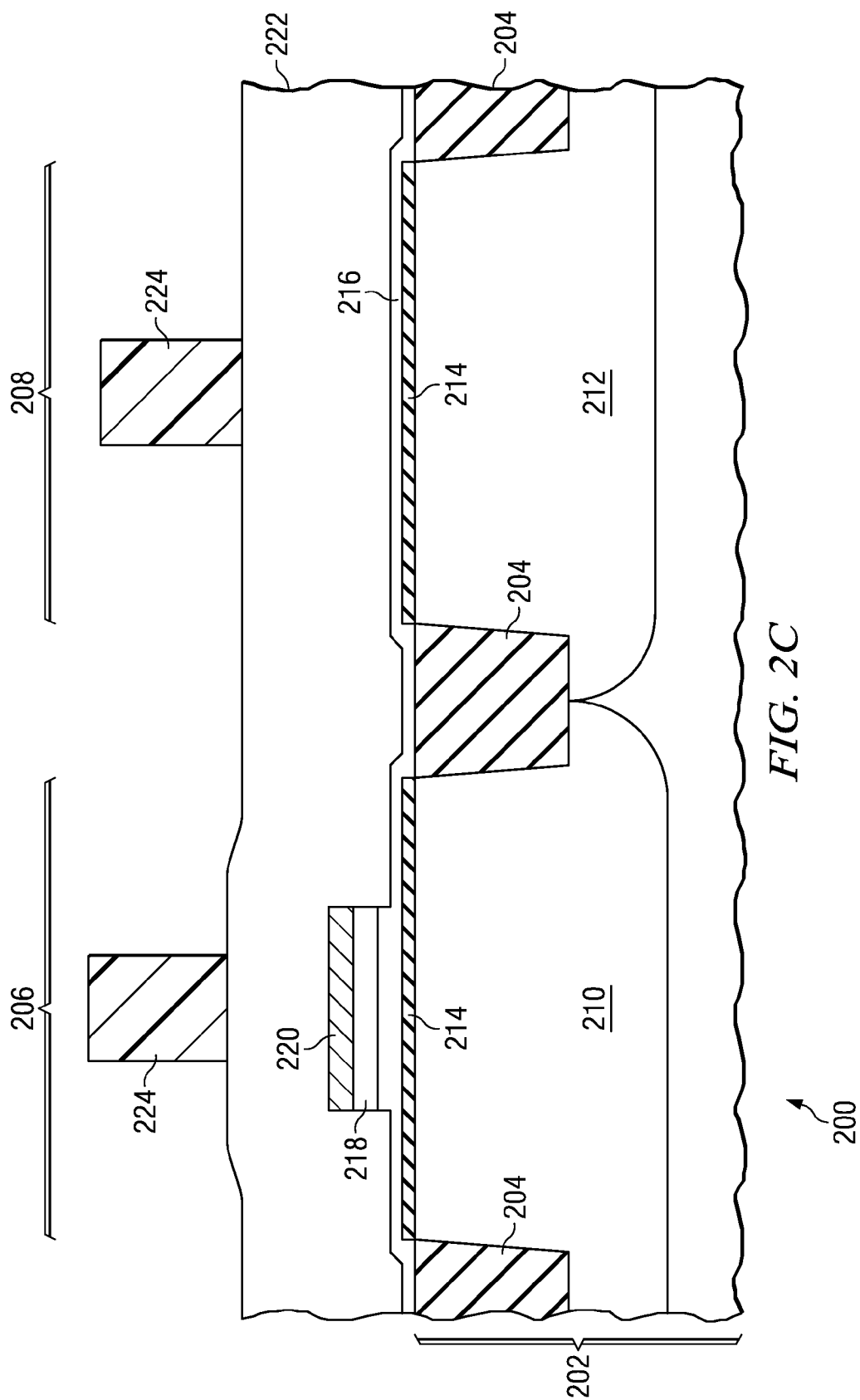

FIG. 2C depicts the IC 200 after a gate photoresist pattern 224 is formed on the top surface of the third polysilicon layer 222. The gate photoresist pattern 224 is formed using known photolithographic methods, and defines an NMOS gate area in the NMOS transistor area 206 and defines a PMOS gate area in the PMOS transistor area 208. Those familiar with photolithographic methods will recognize the reduced height difference of the top surface of the third polysilicon layer 222 improves a process margin of the operation to generate the gate photoresist pattern 224, thus reducing fabrication cost and complexity.

Figure 2D:
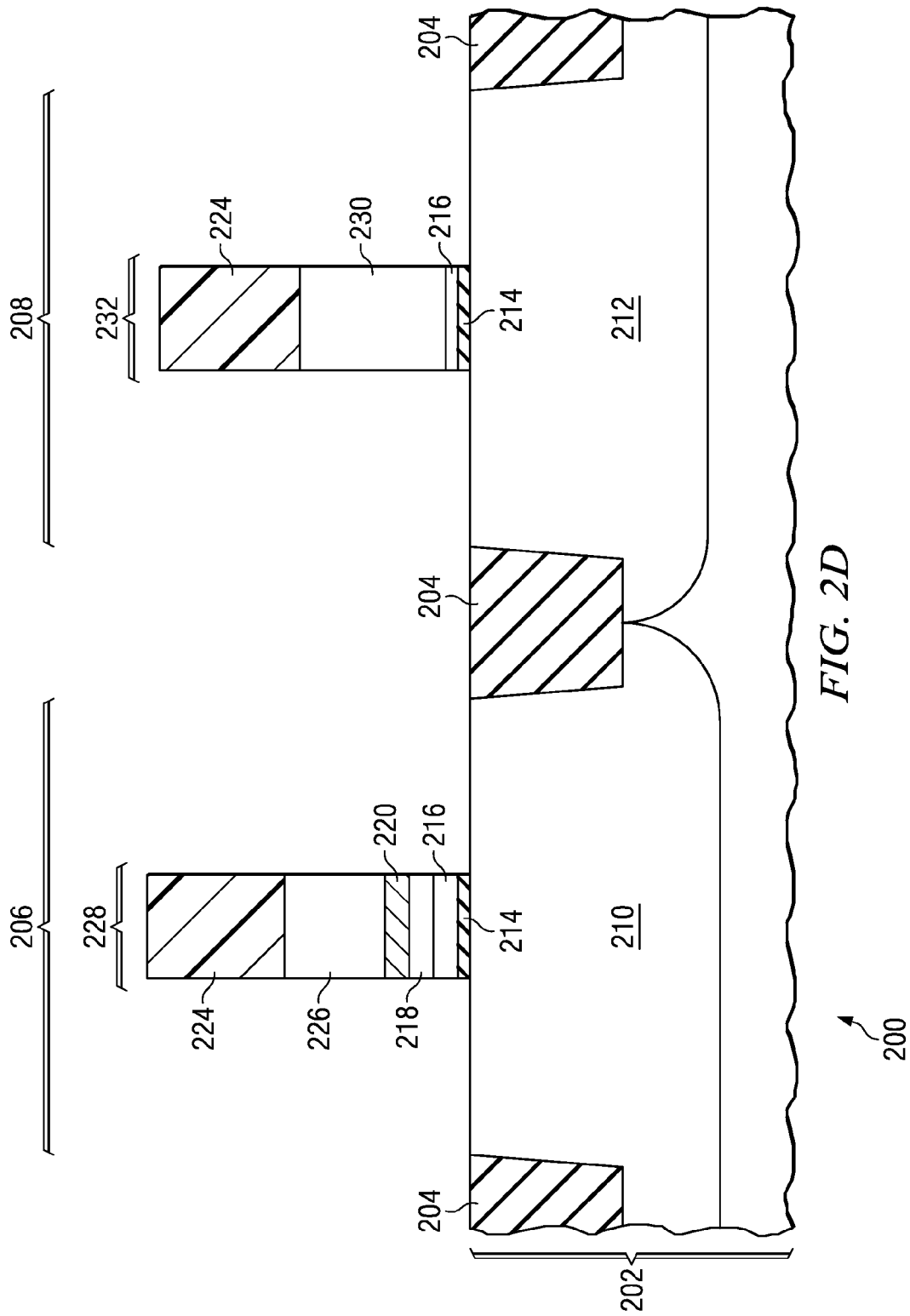

FIG. 2D depicts the IC 200 after a gate etch process. Polysilicon from the third polysilicon layer is removed during the gate etch process using known polysilicon etching methods to form an NMOS upper polysilicon gate layer 226 in the inventive NMOS gate stack 228 defined by the gate photoresist pattern 224 in the NMOS transistor area 206 and to form a PMOS upper polysilicon gate layer 230 in a PMOS gate stack 232 defined by the gate photoresist pattern 224 in the PMOS transistor area 208. Compressively stressed metal 220 is removed during the gate etch process using known metal etching methods outside the area of the NMOS gate stack 228. Polysilicon from the second polysilicon layer 218 is removed during the gate etch process using known polysilicon etching methods outside the area of the NMOS gate stack 228. Similarly, polysilicon from the first polysilicon layer 216 is removed during the gate etch process using known polysilicon etching methods outside the areas of the NMOS gate stack 228 and the PMOS gate stack 232. After the gate etch process is performed, the gate photoresist pattern 224 is removed, commonly by exposing the IC 200 to an oxygen containing plasma, followed by a wet cleanup to remove any organic residue from the top surface of the IC 200.

Figure 2E:
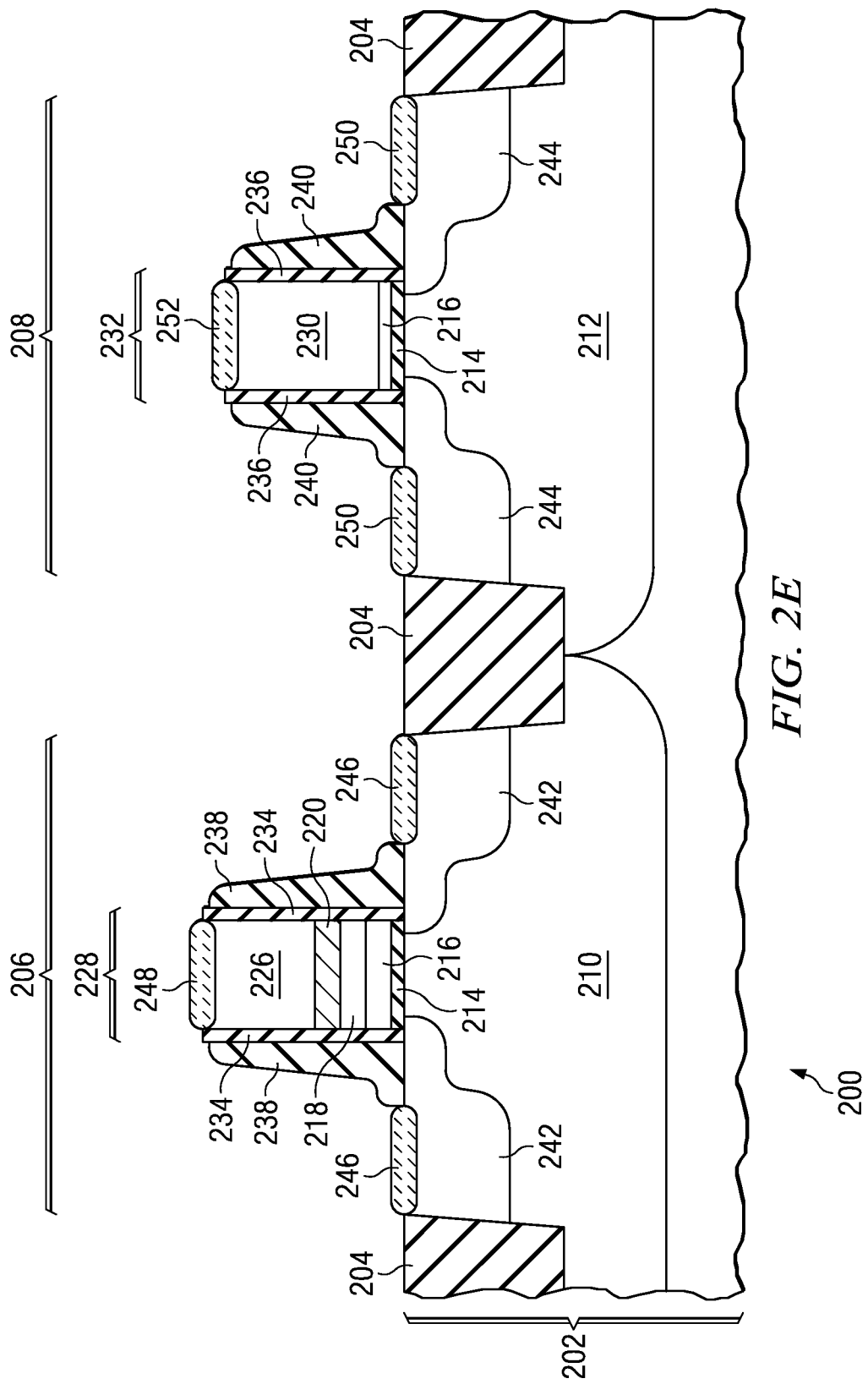

FIG. 2E depicts the IC 200 after fabrication of the NMOS transistor and PMOS transistor is complete. NMOS offset spacers 234 are formed on lateral surfaces of the NMOS gate stack 228, and PMOS offset spacers 236 are formed on lateral surfaces of the NMOS gate stack 232, as described in reference to FIG. 1E. NLDD implanted regions are formed in the top region of the p-well 210 adjacent to the NMOS offset spacers 234, and PLDD implanted regions are formed in the top region of the n-well 212 adjacent to the PMOS offset spacers 236, as described in reference to FIG. 1E. An optional anneal operation may be performed after the NLDD implant operation and/or the PLDD implant operation to activate a portion of the NLDD set of dopants in the NLDD implanted regions and/or activate a portion of the PLDD dopants in the PLDD regions to form NLDD diffused regions and PLDD diffused regions, respectively. NMOS gate sidewall spacers 238 are formed on lateral surfaces of the NMOS offset spacers 234, and PMOS gate sidewall spacers 240 are formed on lateral surfaces of the PMOS offset spacers 236, as described in reference to FIG. 1E. NSD implanted regions are formed in the top region of the p-well 210 adjacent to the NMOS gate sidewall spacers 238, as described in reference to FIG. 1E. An NSD anneal operation activates a portion of the n-type dopants in the NSD implanted regions to form NSD regions 242 which include the NLDD regions. The NSD regions 242 typically extend from the top surface of the p-well 210 to a depth between 100 and 500 nanometers. During the NSD anneal operation, n-type dopants in the second polysilicon layer 218 diffuse into the first polysilicon layer 216 in the NMOS gate stack 228, convert the first polysilicon layer 216 to n-type, and establish a desired work function for the NMOS gate stack 228. PSD implanted regions are formed in the top region of the n-well 212 adjacent to the PMOS gate sidewall spacers 240, as described in reference to FIG. 1E. A PSD anneal operation activates a portion of the p-type dopants in the PSD implanted regions to form PSD regions 244 which include the PLDD regions. The PSD regions 244 typically extend from the top surface of the n-well 212 to a depth between 100 and 500 nanometers. During the PSD anneal operation, p-type dopants from the PMOS upper polysilicon gate layer 230 diffuse into the first polysilicon layer 216 in the PMOS gate stack 232, convert the first polysilicon layer 216 to p-type, and establish a desired work function in the PMOS gate stack 232.

It is common to perform the NSD anneal operation and the PSD anneal operation concurrently.

NSD silicide layers 246 are formed on the top surfaces of the NSD regions 242, an NMOS gate silicide layer 248 is formed on the top surface of the NMOS gate stack 228, PSD silicide layers 250 are formed on the top surfaces of the PSD regions 244, and a PMOS gate silicide layer 252 is formed on the top surface of the PMOS gate stack 232, as described in reference to FIG. 1E.

The second embodiment described in reference to FIG. 2A through FIG. 2E is advantageous because it accrues the advantage of the first embodiment while improving the process margin of the gate photolithography operation.

In an alternate embodiment, the third polysilicon layer 222, as described in reference to FIG. 2A, may be undoped. The PMOS upper polysilicon gate layer 230, as described in reference to FIG. 2D and FIG. 2E, receives p-type dopants during the PSD implant operation, which diffuse into the first polysilicon layer 216 in the PMOS gate stack 232, as described in reference to FIG. 2E, to establish a desirable work function of the PMOS gate stack 232.

Figure 3A:
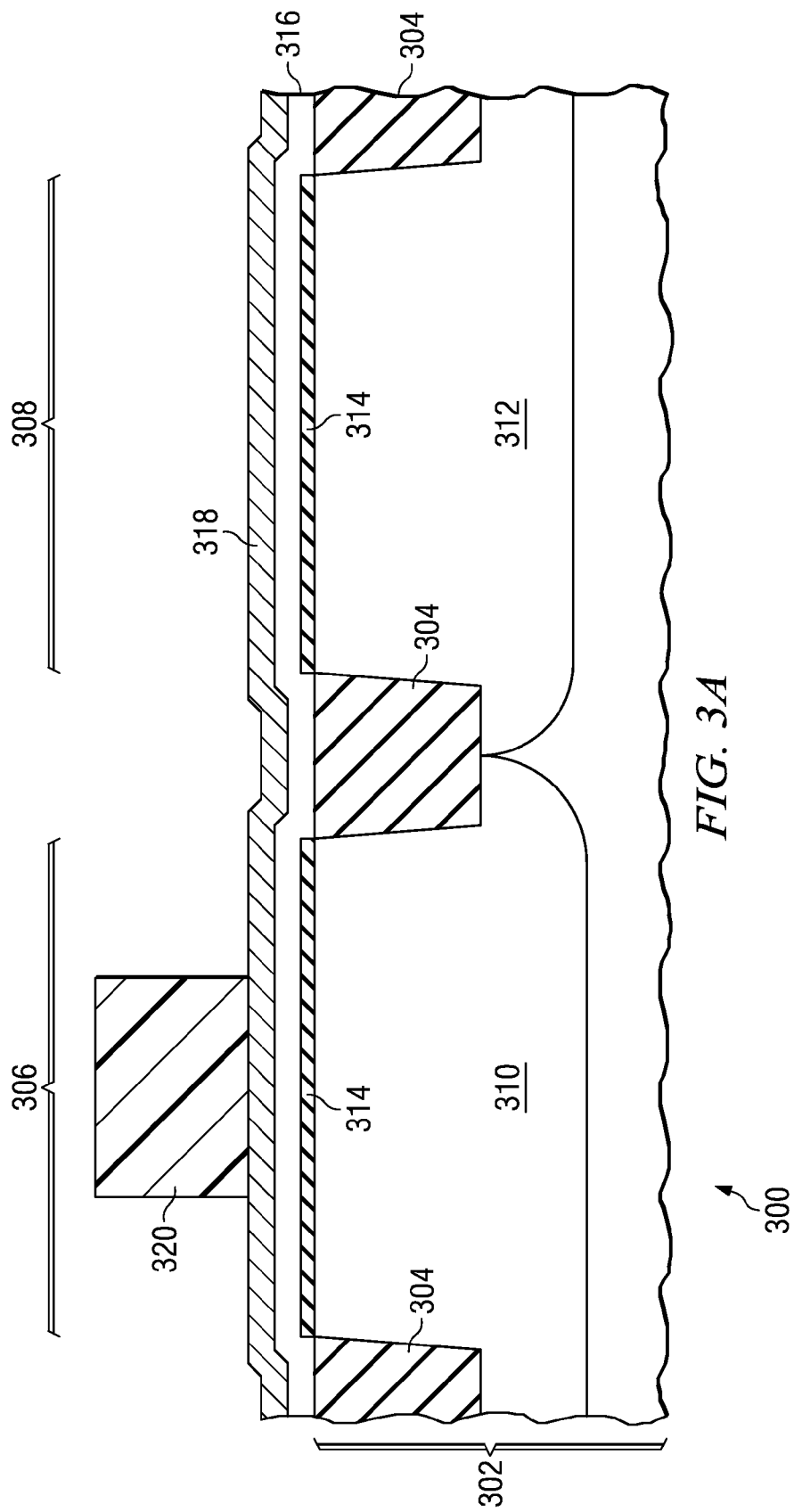
FIG. 3A through FIG. 3E are cross-sections of an IC containing an NMOS transistor including a third embodiment of the inventive gate stack and a PMOS transistor, depicted in successive stages of fabrication.

FIG. 3A through FIG. 3E are cross-sections of an IC containing an NMOS transistor including a third embodiment of the inventive gate stack and a PMOS transistor, depicted in successive stages of fabrication. Referring to FIG. 3A, the IC 300 is formed in a substrate 302 with the properties described in reference to FIG. 1A. Elements of field oxide 304 are formed by an STI process sequence to isolate an area defined for an NMOS transistor 306 from an area defined for a PMOS transistor 308. A p-well 310 is formed in the substrate 302 in the NMOS area 306 by processes described in reference to FIG. 1A. An n-well 312 is formed in the substrate 302 in the PMOS area 308 by processes described in reference to FIG. 1A. A gate dielectric layer 314 as described in reference to FIG. 1A is formed on a top surface of the p-well 310 and a top surface of the n-well 312. A first layer of polysilicon 316, preferably between 2 and 10 nanometers thick, and which includes n-type dopants such as phosphorus, arsenic and/or antimony at a concentration preferably between $1 \cdot 10^{20}$ and $1 \cdot 10^{22}$ cm$^{-2}$, is formed on a top surface of the gate dielectric layer 314, using known polysilicon deposition methods. A layer of compressively stressed metal 318, with properties described in reference to FIG. 1A, preferably between 10 and 30 nanometers thick, is formed on a top surface of the first polysilicon layer 316, using known metal deposition methods. An NMOS stress layer photoresist pattern 320 is formed on a top surface of the compressively stressed metal layer 318 in the NMOS transistor area 306 using known photolithographic methods to define areas for the NMOS stress layer. In a preferred embodiment, the area defined for the NMOS stress layer is larger than an area of the final NMOS gate stack, to be defined in a subsequent process step.

Figure 3B:
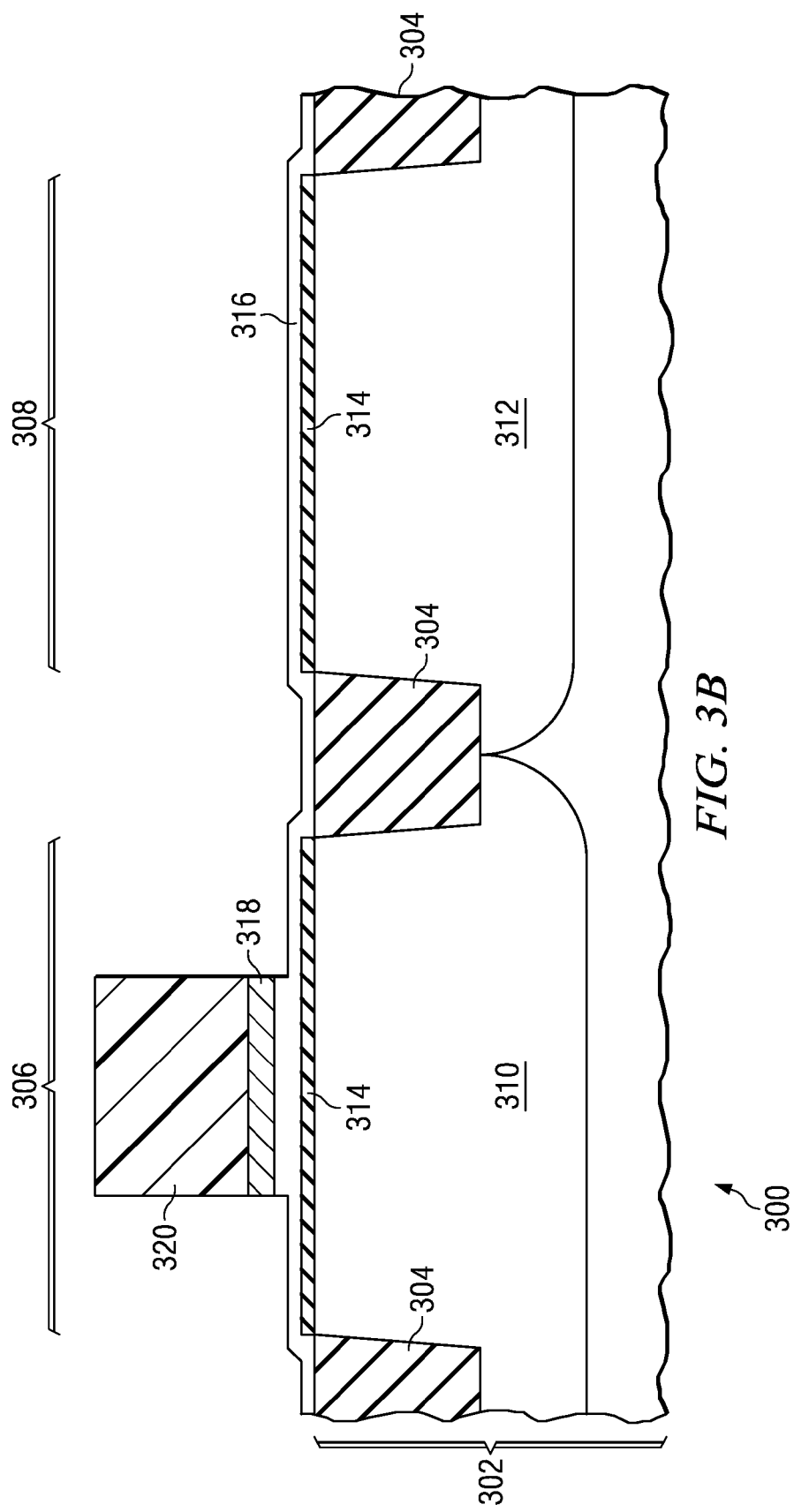

FIG. 3B depicts the IC 300 after an NMOS stress layer etch process. Compressively stressed metal 318 is removed from areas outside the NMOS gate stack area using known metal etching methods. A portion of the first polysilicon layer 316 is removed from areas outside the NMOS stress layer area, preferably leaving more than 2 nanometers of polysilicon on the top surface of the gate dielectric layer 314, using known polysilicon etching methods. It is advantageous to have a single polysilicon layer 316 under the compressively stressed metal layer 318 because a process margin of the etch step in which a portion of the first polysilicon layer 316 is left on the gate dielectric layer 314 in the PMOS area 308 is increased, resulting is reduced fabrication cost and complexity. It is furthermore advantageous to have a reduced thickness of polysilicon 316 under the compressively stressed metal layer 318 because tensile stress in a channel region under the gate stack is increased. After the NMOS stress layer etch process is performed, the NMOS stress layer photoresist pattern 320 is removed, commonly by exposing the IC 300 to an oxygen containing plasma, followed by a wet cleanup to remove any organic residue from the top surface of the IC 300.

Figure 3C:
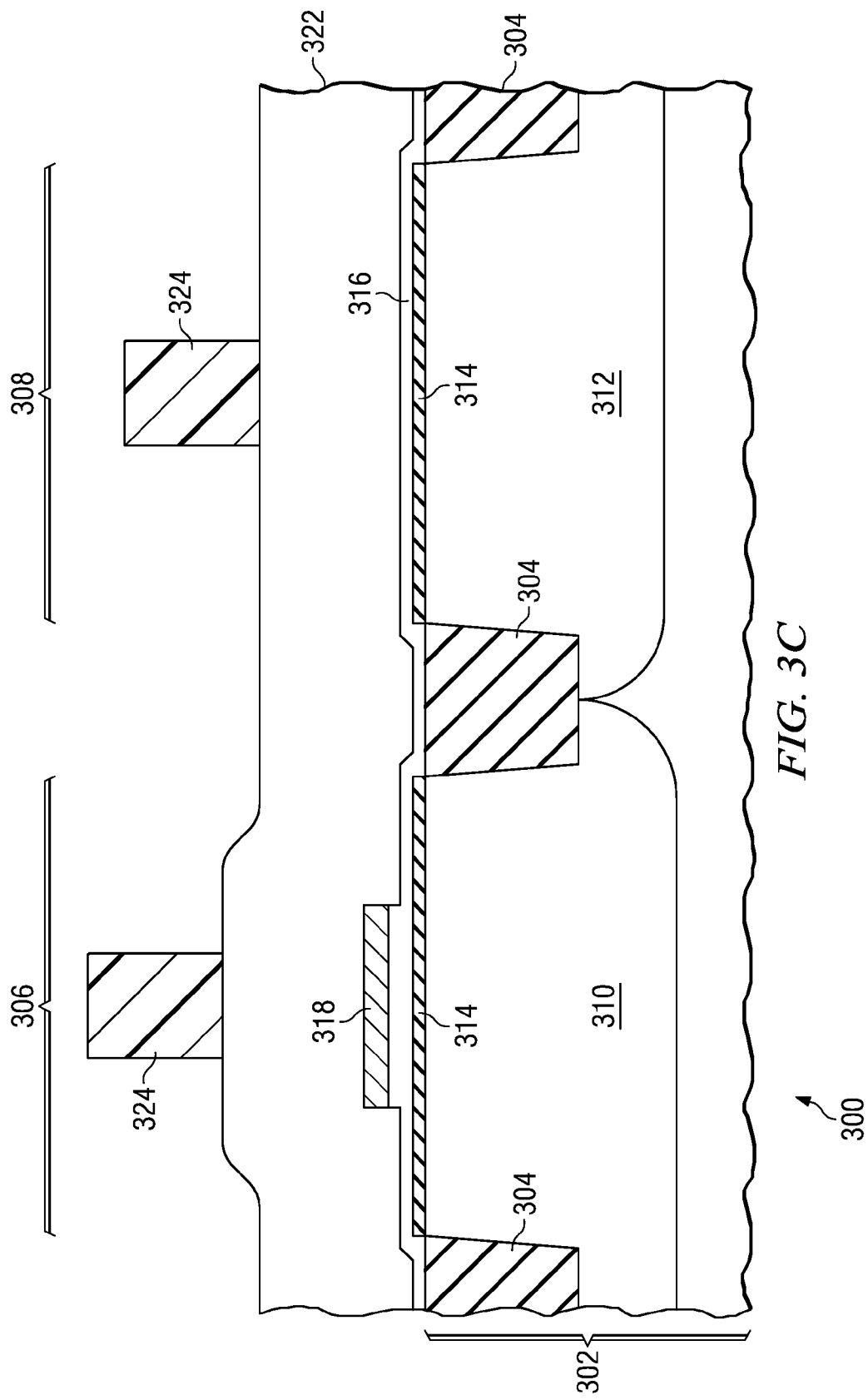

FIG. 3C depicts the IC 300 at a subsequent stage of fabrication. A second layer of polysilicon 322 is formed on the top surface of the IC 300. The second polysilicon layer is preferably between 30 and 70 nanometers thick, and includes p-type dopants such as boron, and possibly indium and/or gallium, at a concentration preferably between $1 \cdot 10^{19}$ and $1 \cdot 10^{22}$ cm$^{-2}$. A gate photoresist pattern 324 is formed on a top surface of the second polysilicon layer 322 using known photolithographic methods to define areas for gates of an NMOS transistor and a PMOS transistor in the NMOS transistor area 306 and the PMOS transistor area 308, respectively.

Figure 3D:
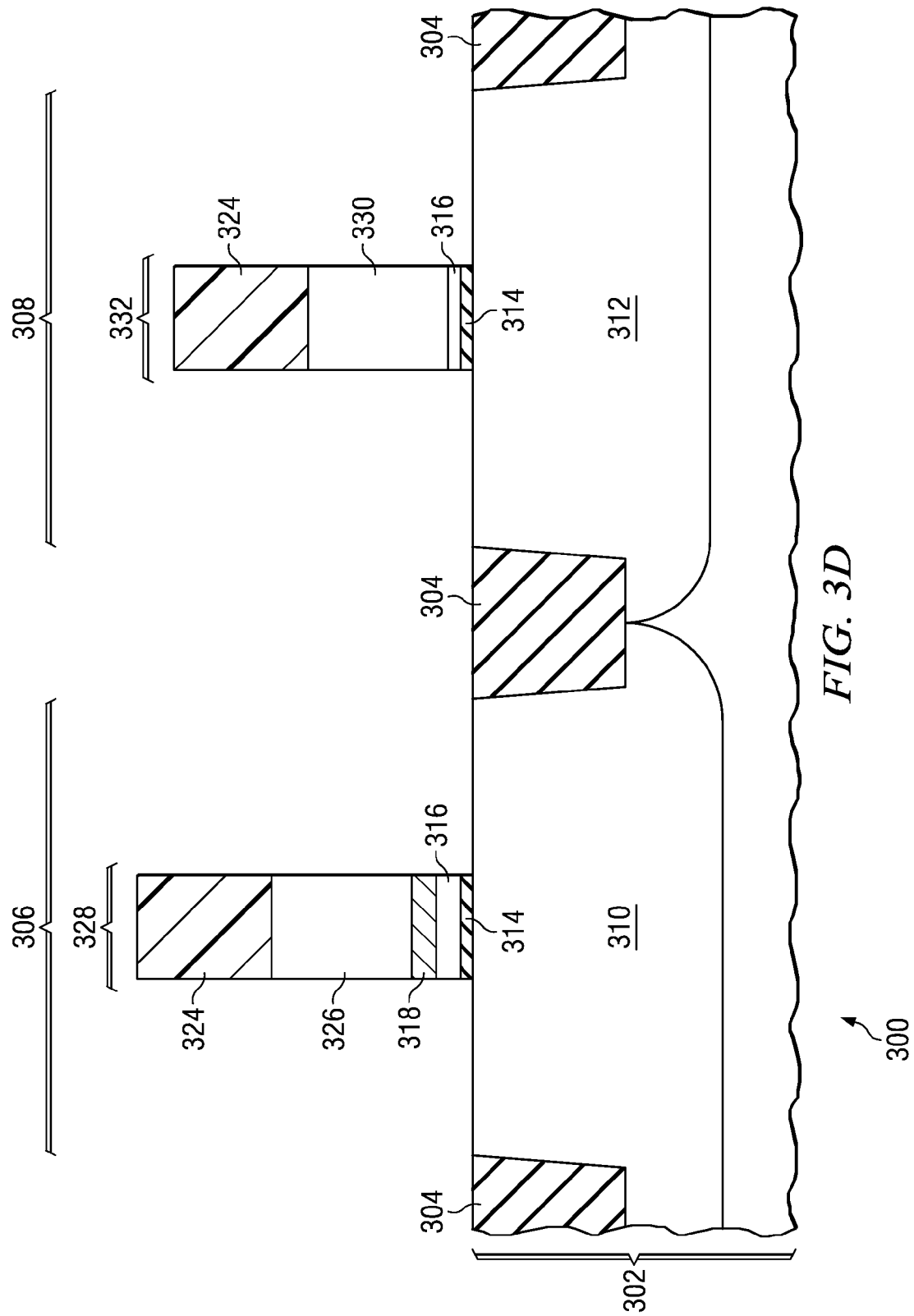

FIG. 3D depicts the IC 300 after a gate etch process. Polysilicon from the second polysilicon layer is removed during the gate etch process using known polysilicon etching methods to form an NMOS upper polysilicon gate layer 326 in the inventive NMOS gate stack 328 defined by the gate photoresist pattern 324 in the NMOS transistor area 306 and to form a PMOS upper polysilicon gate layer 330 in a PMOS gate stack 332 defined by the gate photoresist pattern 324 in the PMOS transistor area 308. Compressively stressed metal 318 is removed during the gate etch process using known metal etching methods outside the area of the NMOS gate stack 328. Polysilicon from the first polysilicon layer 316 is removed during the gate etch process using known polysilicon etching methods outside the areas of the NMOS gate stack 328 and the PMOS gate stack 332. After the gate etch process is performed, the gate photoresist pattern 324 is removed, commonly by exposing the IC 300 to an oxygen containing plasma, followed by a wet cleanup to remove any organic residue from the top surface of the IC 300.

Figure 3E:
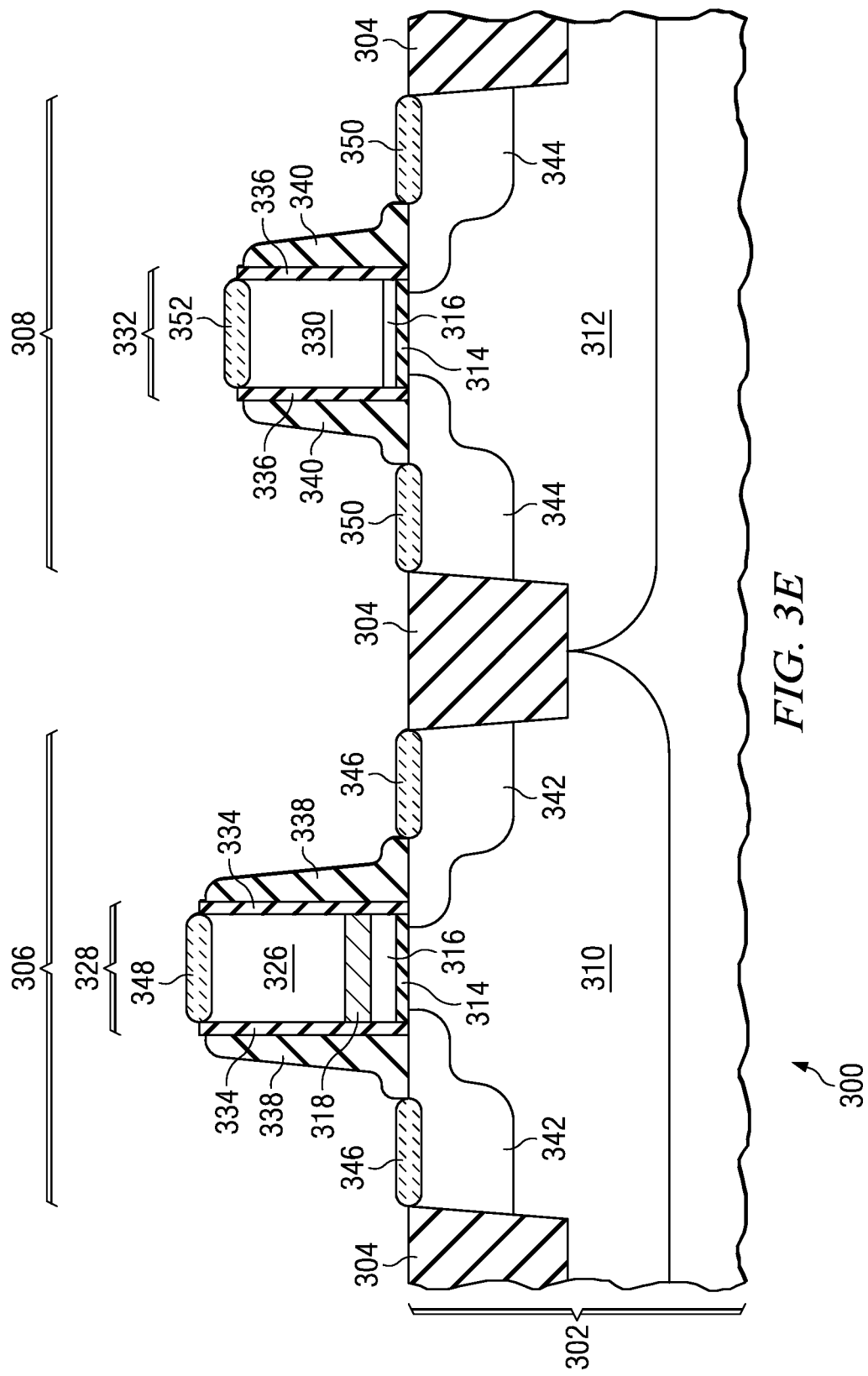

FIG. 3E depicts the IC 300 after fabrication of the NMOS transistor and PMOS transistor is complete. NMOS offset spacers 334 are formed on lateral surfaces of the NMOS gate stack 328, and PMOS offset spacers 336 are formed on lateral surfaces of the NMOS gate stack 332, as described in reference to FIG. 1E. NLDD implanted regions are formed in the top region of the p-well 310 adjacent to the NMOS offset spacers 334, and PLDD implanted regions are formed in the top region of the n-well 312 adjacent to the PMOS offset spacers 336, as described in reference to FIG. 1E. An optional anneal operation may be performed after the NLDD implant operation and/or the PLDD implant operation to activate a portion of the NLDD set of dopants in the NLDD implanted regions and/or activate a portion of the PLDD dopants in the PLDD regions to form NLDD diffused regions and PLDD diffused regions, respectively. NMOS gate sidewall spacers 338 are formed on lateral surfaces of the NMOS offset spacers 334, and PMOS gate sidewall spacers 340 are formed on lateral surfaces of the PMOS offset spacers 336, as described in reference to FIG. 1E. NSD implanted regions are formed in the top region of the p-well 310 adjacent to the NMOS gate sidewall spacers 338, as described in reference to FIG. 1E. An NSD anneal operation activates a portion of the n-type dopants in the NSD implanted regions to form NSD regions 342 which include the NLDD regions. The NSD regions 342 typically extend from the top surface of the p-well 310 to a depth between 100 and 500 nanometers. It is advantageous to have a single polysilicon layer 316 under the compressively stressed metal layer 318 because a work function of the NMOS gate stack 332 may be more accurately established compared to embodiments including an undoped polysilicon layer below the compressively stressed metal layer.

PSD implanted regions are formed in the top region of the n-well 312 adjacent to the PMOS gate sidewall spacers 340, as described in reference to FIG. 1E. A PSD anneal operation activates a portion of the p-type dopants in the PSD implanted regions to form PSD regions 344 which include the PLDD regions. The PSD regions 344 typically extend from the top surface of the n-well 312 to a depth between 100 and 500 nanometers. During the PSD anneal operation, p-type dopants from the PMOS upper polysilicon gate layer 330 diffuse into the first polysilicon layer 316 in the PMOS gate stack 332, convert the first polysilicon layer 316 to p-type, and establish a desired work function in the PMOS gate stack 332.

It is common to perform the NSD anneal operation and the PSD anneal operation concurrently.

NSD silicide layers 346 are formed on the top surfaces of the NSD regions 342, an NMOS gate silicide layer 348 is formed on the top surface of the NMOS gate stack 328, PSD silicide layers 350 are formed on the top surfaces of the PSD regions 344, and a PMOS gate silicide layer 352 is formed on the top surface of the PMOS gate stack 332, as described in reference to FIG. 1E.

The third embodiment described in reference to FIG. 3A through FIG. 3E is advantageous because it accrues the advantage of the first embodiment while improving the process margin of the NMOS stress layer etch operation and further improving NMOS transistor performance.

In an alternate embodiment, the third polysilicon layer 322, as described in reference to FIG. 3A, may be undoped. The PMOS upper polysilicon gate layer 330, as described in reference to FIG. 3D and FIG. 3E, receives p-type dopants during the PSD implant operation, which diffuse into the first polysilicon layer 316 in the PMOS gate stack 332, as described in reference to FIG. 3E, to establish a desirable work function of the PMOS gate stack 332.

What is claimed is:

1. A method of forming a CMOS IC, comprising the steps of:
    forming a first polysilicon layer on a top surface of a first gate dielectric layer in an NMOS area and a top surface of a second gate dielectric layer in a PMOS area;
    forming a compressively stressed metal layer on a top surface of said first polysilicon layer;
    forming an NMOS stress layer photoresist pattern on a top surface of said compressively stressed metal layer in said NMOS area;
    removing said compressively stressed metal layer from areas exposed by said NMOS stress layer photoresist pattern;
    removing a portion of said first polysilicon layer from areas exposed by said NMOS stress layer photoresist pattern;
    forming a second polysilicon layer on a top surface of said compressively stressed metal layer and a top surface of said first polysilicon layer;
    forming a gate photoresist pattern on a top surface of said second polysilicon layer in said NMOS area over said compressively stressed metal layer and in said PMOS area;
    removing said second polysilicon layer, said compressively stressed metal layer, and said first polysilicon layer from areas exposed by said gate photoresist pattern.

2. The method of claim 1, in which said compressively stressed metal layer is comprised of a material selected from the group consisting of TiN, TaN, W and Mo.

3. The method of claim 1, in which said compressively stressed metal layer is between 10 and 30 nanometers thick.

4. The method of claim 1, in which said step of forming a second p-type polysilicon layer further comprises the step of performing a polysilicon chemical mechanical polish (CMP) operation in such a manner as to reduce a difference in height in said top surface of said second p-type polysilicon layer in said NMOS area and said PMOS area to less than 10 nanometers.

5. The method of claim 1:
    in which said step of forming said first polysilicon layer further comprises the steps of:
        forming a first sublayer of undoped polysilicon on said top surface of said first gate dielectric layer in said NMOS area and said top surface of said second gate dielectric layer in said PMOS area; and
        forming a second sublayer of n-type polysilicon on a top surface of said first sublayer of undoped polysilicon; and
    in which said step of removing said compressively stressed metal layer and a portion of said first polysilicon layer from areas exposed by said NMOS stress layer photoresist pattern further comprises the steps of:
        removing said second sublayer of n-type polysilicon from areas exposed by said NMOS stress layer photoresist pattern; and
        removing a portion of said first sublayer of undoped polysilicon from areas exposed by said NMOS stress layer photoresist pattern; and
    further comprising the steps of:
        performing an n-type source/drain (NSD) anneal operation which causes n-type dopants in said second sublayer of n-type polysilicon to diffuse into said first sublayer of undoped polysilicon in said NMOS area; and
        performing a p-type source/drain (PSD) anneal operation which causes p-type dopants in said second polysilicon layer to diffuse into said first sublayer of undoped polysilicon in said PMOS area.

6. The method of claim 1, in which said first polysilicon layer is n-type.

7. The method of claim 1, in which said second polysilicon layer is p-type.

8. The method of claim 1, in which said second polysilicon layer is undoped.

* * * * *